(12) United States Patent
Hwang et al.

(10) Patent No.: US 7,892,971 B2
(45) Date of Patent: Feb. 22, 2011

(54) SUB-SECOND ANNEALING PROCESSES FOR SEMICONDUCTOR DEVICES

(75) Inventors: Jack Hwang, Portland, OR (US); Sridhar Govindaraju, Hillsboro, OR (US); Karson Knutson, Beaverton, OR (US); Harold Kennel, Portland, OR (US); Aravind Killampalli, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 425 days.

(21) Appl. No.: 12/164,560

(22) Filed: Jun. 30, 2008

(65) Prior Publication Data

US 2009/0325392 A1 Dec. 31, 2009

(51) Int. Cl.
*H01L 21/44* (2006.01)
(52) U.S. Cl. .................. 438/663; 438/660; 438/664; 257/E21.199

(58) Field of Classification Search .............. 438/660, 438/663, 664, 540, 581, 583, 630, 649, 651, 438/655, FOR. 338, FOR. 360; 257/E21.199, 257/E29.147
See application file for complete search history.

(56) References Cited

U.S. PATENT DOCUMENTS

2005/0186723 A1* 8/2005 Kim .......................... 438/200
2009/0272979 A1* 11/2009 Green .......................... 257/72

* cited by examiner

*Primary Examiner*—Thanh V Pham
(74) *Attorney, Agent, or Firm*—Winkle, PLLC

(57) ABSTRACT

An annealing method and apparatus for semiconductor manufacturing is described. The method and apparatus allows an anneal that can span a thermal budget and be tailored to a specific process and its corresponding activation energy. In some cases, the annealing method spans a timeframe from about 1 millisecond to about 1 second. An example for this annealing method includes a sub-second anneal method where a reduction in the formation of nickel pipes is achieved during salicide processing. In some cases, the method and apparatus combine the rapid heating rate of a sub-second anneal with a thermally conductive substrate to provide quick cooling for a silicon wafer. Thus, the thermal budget of the sub-second anneal methods may span the range from conventional RTP anneals to flash annealing processes (including duration of the anneal, as well as peak temperature). Other embodiments are described.

15 Claims, 4 Drawing Sheets

SUB-SECOND ANNEALING PROCESSES FOR SEMICONDUCTOR DEVICES

BACKGROUND

Semiconductor devices are built in semiconductor materials, typically silicon wafers (or substrates), through a series of processes. These processes modify the silicon wafer by building components of the semiconductor devices in the wafer using a variety of materials, including conductive materials, insulating materials, and semiconducting materials. Many of the processes to build these components involve the use of thermal treatments that work to overcome the activation energies that govern the processes. These activation energies determine the rate of construction or modification of the components using the respective thermal treatment.

One such thermal treatment is rapid thermal processing (RTP). In RTP, suitable silicon substrates are heated rapidly to achieve target temperatures using lamp based systems, such as halogen based lamp systems. The rate of heating and the time duration at the target temperature are tailored to each process based on the activation energy of the process. Generally, RTP processes are applied for a time duration on the order of 1 second. Applications of RTP include the formation of salicide layers on the source and drain regions of a transistor.

Other forms of thermal treatments include flash and laser annealing processes, which employ shorter time periods than RTP anneals, often on the order of milliseconds to microseconds. Thermal treatments, such as RTP, flash annealing, and laser annealing enable tailoring of thermal budgets to process specific requirements, such as activation energies.

BRIEF DESCRIPTION OF THE DRAWINGS

The following description can be better understood in light of the Figures, in which.

Figure 1:
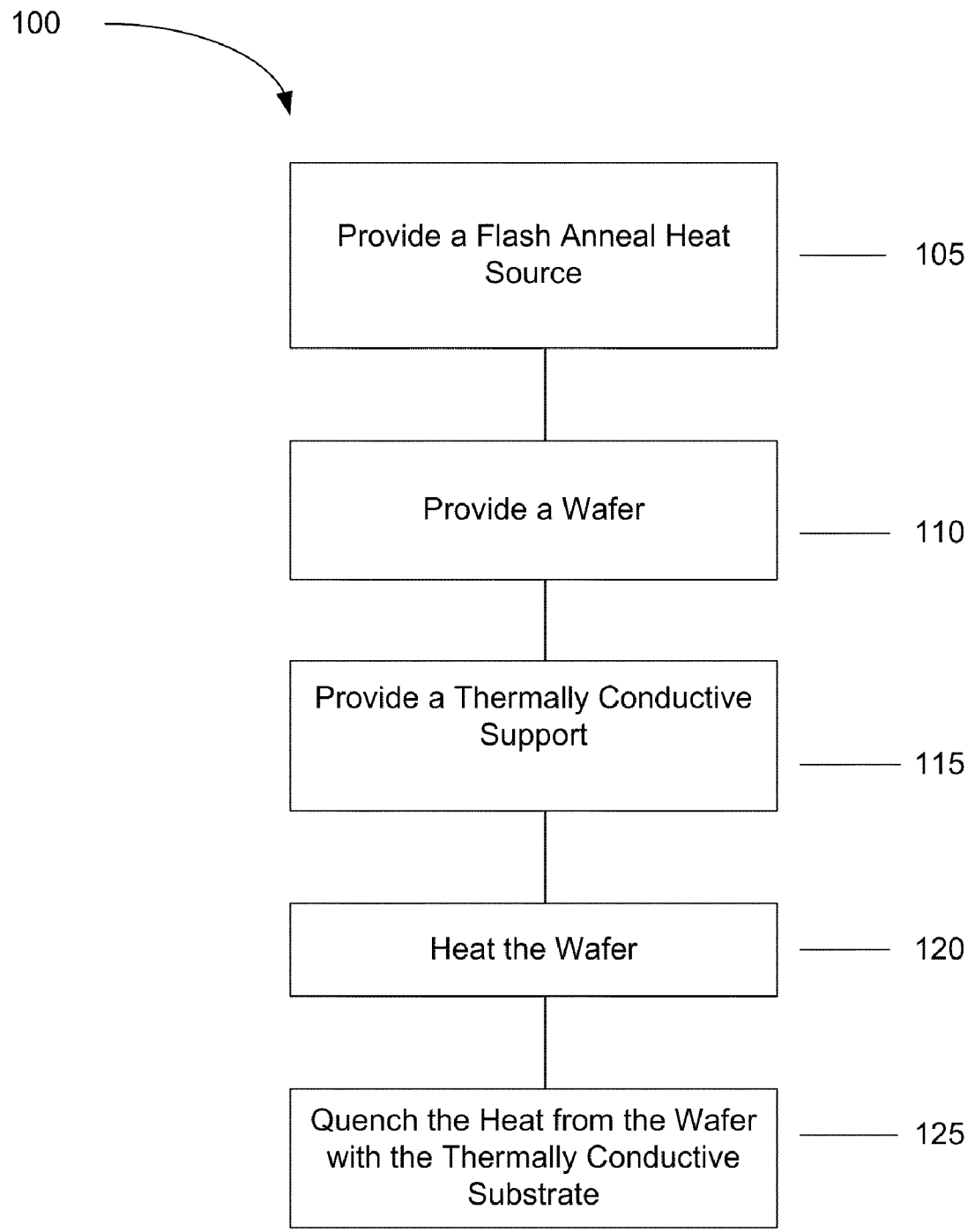
FIG. 1 contains a flow chart depicting some embodiments of a sub-second annealing process.

The Figures illustrate some specific aspects of the RTP methods and associated apparatus for carrying out such methods. Together with the following description, the Figures demonstrate and explain the principles of the RTP methods and associated apparatus for carrying out such methods. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their descriptions will not be repeated.

DETAILED DESCRIPTION

The following description of a sub-second anneal supplies specific details in order to provide a thorough understanding. Nevertheless, the skilled artisan would understand that the RTP methods and associated apparatus for performing such methods can be implemented and used without employing these specific details. Accordingly, while the description focuses on RTP for salicides in semiconductor devices, it can be modified to be used in other processes that are used in semiconductor fabrication. For example, while the following detailed description focuses on implementing the described methods and apparatus for annealing nickel to a silicon wafer to form nickel salicide, the described methods and apparatus may be implemented with other metals or substrates, as desired.

As will be recognized by those of skill in the art, a salicide region refers to a self-aligning silicide region. To form a conventional salicide, a metal (e.g., titanium, cobalt, or nickel) may be deposited on source/drain (S/D) regions of a silicon substrate and then be heated. In this manner, the silicon is caused to react with the metal to form a salicide layer, such as a layer of titanium silicide, cobalt disilicide, or nickel silicide. Any areas of unreacted metal may be removed by etching. The thermal budget of the heating process must be sufficient to promote the reaction of the metal with the silicon while minimizing unwanted diffusion of the metal into the silicon substrate. The thermal budget must therefore be optimized simultaneously for the activation energy of the metal-plus-silicon reaction and the activation energy of the diffusion process.

The heating process, also referred to as an annealing process, may be performed using a conventional RTP process. Using conventional RTP, the heating process and the subsequent cooling process may both be performed in a controlled manner. Often, the starting temperature for the anneal and the power transferred to the wafer determine the peak temperature of the process and the thermal budget.

Nickel is a common metal that can be used with a silicon wafer to form a salicide. When conventional RTP processes are used to anneal nickel deposited on a silicon material, the heating that causes the salicide reaction may promote diffusion of the nickel along grain boundaries and extended crystal defects in the silicon material. This diffusion may form nickel pipes or dendrites, which may contact each other and/or extend between adjacent source and drain regions of the semiconductor device to cause source-to-drain leakage paths. These paths may then compromise the device's yield, performance, and/or reliability.

To reduce nickel pipe formation, flash and laser anneal processes have been used. The conventional flash anneal processes often last about 1 millisecond and are about 1,000 times faster than most conventional RTP methods. The peak temperature of the laser anneal may be constrained, however, to prevent damage to other materials present on the silicon substrate, such as other metals, including hafnium dioxide, zirconium dioxide, titanium dioxide, etc. Lower temperatures during salicide formation may also be used to suppress the formation of nickel pipes. However, lower temperatures may also cause a loss of device performance.

In accordance with some implementations, a novel sub-second annealing process is used to optimize the thermal profile applied to semiconductor processes involving multiple activation energies, including processes used to form salicide layers on a silicon substrate. The described sub-second annealing process enhances processes that have relatively higher activation energies (i.e., chemical reaction kinetics, such as silicide formation) and minimizes processes that have relatively lower activation energies (i.e., diffusion kinetics). This enables the described sub-second annealing process to form high quality salicide regions while inhibiting diffusion of metal into the silicon substrate. In this manner, the sub-second annealing process reduces the occurrence of defects, such as nickel pipes or dendrites.

In some embodiments, the described methods include using an additional heat source to raise the temperature of the silicon substrate or wafer to an intermediate value prior to the sub-second anneal. This additional heat source may be a conductive or a radiative source.

The described sub-second annealing process involves a rapid heat-up, which can be combined with the use of a thermally conductive substrate or thermally conductive support for the substrate to provide a rapid cooling process. Thus, the thermal cycle of the described sub-second anneal may be equivalent to or shorter than the thermal cycle of a conventional RTP. At the same time, the sub-second anneal may be longer than current state of the art flash/laser anneal processes. The sub-second anneal can be engineered to provide similar or lower thermal budgets than conventional RTP methods. For similar thermal budgets, these anneals can enable the attainment of peak temperatures that are higher than conventional RTP processes and lower than conventional flash/laser anneal processes.

FIG. 1 depicts some embodiments of such a sub-second annealing method. In the method 100 shown in FIG. 1, a wafer can be heated over a wide range of thermal budgets and for any suitable application related to the manufacturing of semiconductor devices. While not shown in FIG. 1, the method 100 can involve an optional heat source (either conductive or radiative) to enable a wafer to attain a suitable intermediate temperature prior to the sub-second anneal with the heat source in block 105. Any known heat source may be used to heat the water to an intermediate temperature or for the sub-second anneal heat source in block 105. Moreover, this heat source may heat either the entire thickness of the wafer or a fraction of the wafer for a suitable length of time. For example, a bank of intense light sources may be used to heat the wafer by emitting light over any suitable range of wavelengths. In this example, the bank of intense light sources may comprise any suitable intense light source that may be used to rapidly heat the wafer. Some non-limiting examples of suitable intense light sources may include xenon lamps or arc flashes.

As shown at block 110, the method 100 continues by providing a wafer (not limited to silicon wafers). The wafer can include virtually any suitable wafer that can be heated by the heat source and then cooled either by the unheated fraction of the wafer or by a thermally conductive support, as described below. The wafer may also comprise a metal, like nickel, that may be annealed and result in the reaction of the metal with the silicon surface that is in or on the wafer to form a metal silicide. The wafer may contain any semiconductor device having a metal adjacent to a silicon surface. The sub-second anneal can be utilized for any process involving a combination of activation energies where the anneal temperature-time combination can be tailored to drive desired processes with relatively high activation energies and minimize or impede undesired processes with relatively low activation energies.

Figure 2:
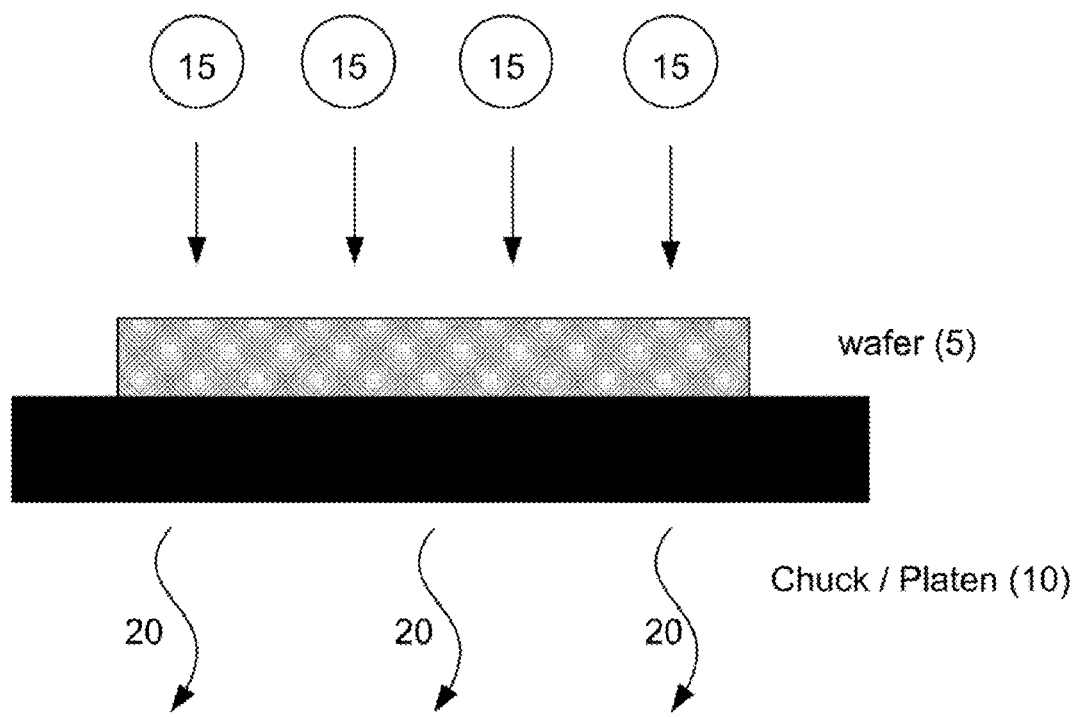
FIG. 2 depicts some embodiments of an apparatus that can be used to perform a sub-second annealing process.

In some embodiments, the flash anneal does not heat the entire thickness of the wafer. In such embodiments, the unheated thickness can be used as a conductive substrate to cool the wafer by quenching heat from the wafer through thermal conduction. In other embodiments, however, block 115 shows an additional thermally conductive support for the wafer is used to provide rapid cooling. In still other embodiments that are not illustrated, gas flow is used to provide convective heat transfer, resulting in additional cooling The thermally conductive support may comprise any suitable design that quenches heat from the wafer in a suitable amount of time. Some non-limiting examples of suitable thermally conductive supports may include a temperature-controlled hotplate, wafer chuck, platen, vacuum-chuck, or other thermally conductive element that acts as a heat sink for the wafer after the wafer has been heated. Indeed, FIG. 2 shows some embodiments where a wafer chuck or platen 10 that is turned off, so as not to produce its own heat, serves as the thermally conductive support that quenches heat 20 from the wafer 5.

Block 120 in FIG. 1 illustrates that the method 100 may continue by using the sub-second anneal heat source to heat the wafer. For example, light and/or energy from the heat source may be emitted towards the wafer for any period of time necessary to heat either a fraction of or the entire thickness of the wafer. For example, the light and energy from a suitable flash anneal heat source may be emitted towards the wafer for a period of a few milliseconds to tens of milliseconds. In some embodiments, light and/or energy are emitted from the heat source for a period of time from about 1 to about 20 milliseconds. In other embodiments, light and/or energy from the heat source are emitted for a period of time from about 0.01 to about 100 milliseconds.

The amount of energy used in the heating process will depend on the length of the heating process. In some embodiments, the energy emitted from the heat source ranges from about 10 to about 40 J/cm$^2$. In other embodiments, the energy emitted from the heat source ranges from about 1 to about 100 J/cm$^2$. In still other embodiments, the energy emitted from the heat source is from about 1 to about 1,000 J/cm$^2$.

Figure 3:
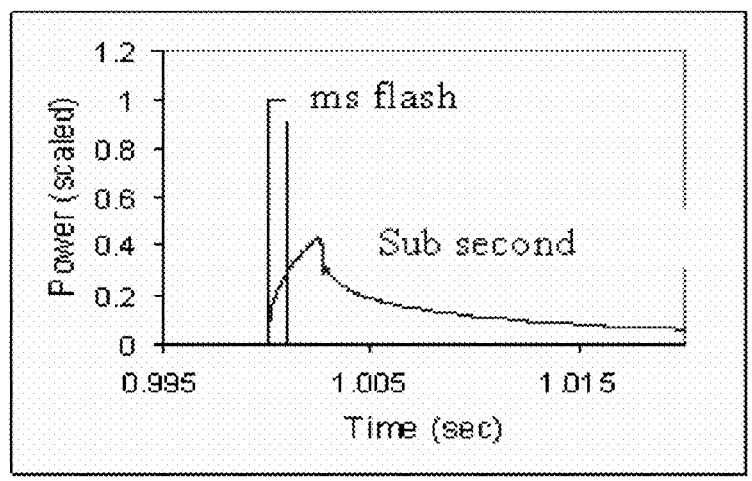
FIG. 3 contains a graph illustrating the relationship between power and time for flash/laser annealing and some embodiments of a sub-second annealing process.

The power provided to the heat source to create light and/or energy may be modulated to prevent overheating the wafer and degrading the metal. FIG. 3 contains a graph showing an exemplary relationship between power supplied for both a millisecond flash anneal process and the sub-second anneal method. Specifically, FIG. 3 illustrates that unlike millisecond flash anneal processes that apply a relatively high amount of power for a relatively short period of time, the sub-second anneal method (such as the method 100 shown in FIG. 1) may supply enough power to bring the wafer to a target temperature. However, after the amount of power used in the sub-second anneal peaks, and the target temperature is reached, additional power may be supplied as necessary to maintain a constant temperature over a suitable period of time until either a fractional thickness of the wafer or the whole thickness of wafer is heated. For example, FIG. 3 illustrates that, in some embodiments, after the amount of power peaks in the sub-second anneal method, a diminishing amount of power may be supplied for approximately 15 milliseconds.

After the wafer has been heated, block 125 in FIG. 1 shows the heat from the wafer may be quenched (either by the unheated thickness or by a thermally conductive support) so that the wafer may be cooled to return to its pre-anneal temperature. The time required for that cool down process will depend on cooling rate of the thermally conductive substrate, but in some embodiments, ranges from about 5 to about 15 seconds. Accordingly, the cooling rate of the cooling process can range from about 5 to about 200 degrees/second.

In some embodiments, the thermal cycle of the sub-second anneal method differs from the thermal cycle for either conventional RTP or flash/laser anneal. For example, FIG. 4 contains a time verses temperature graph depicting the exemplary thermal cycles for conventional RTP (labeled as RTP/Spike anneal), flash anneal, and the sub-second anneal method. In that Figure, the dotted lines are used to represent the time-temperature profile of sub-second anneal method.

The time-temperature profile of the sub-second anneal method is shown next to the time-temperature profiles of conventional RTP and flash anneal processes to provide a comparison between the different thermal cycles.

Figure 4:
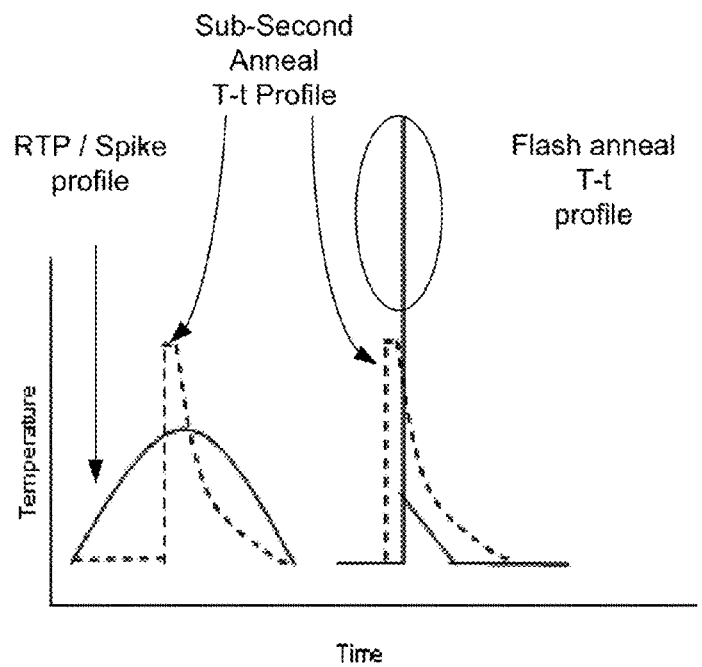
FIG. 4 contains a graph illustrating an exemplary time and temperature relationship for RTP/spike anneal, flash anneal, and some embodiments of a sub-second annealing process.

FIG. 4 illustrates that, in some embodiments, the duration of, or the time required by, the sub-anneal method may differ from both conventional RTP and flash anneal. For instance, with respect to conventional RTP, FIG. 4 shows the thermal process of the sub-second anneal method may be shorter than conventional RTP. FIG. 4 also illustrates that, in embodiments where the sub-second anneal method may not begin to heat the wafer until the conventional RTP process has almost reached its peak temperature, the wafer in both processes may be completely cooled at substantially the same time. Indeed, in some embodiments, the sub-second anneal method may be about 10 to about 10,000 times faster than conventional RTP. The thermal cycle for the sub-second anneal can be optimized to drive desired processes with relatively high activation energies (such as the formation of nickel salicide) while impeding undesired processes with relatively low activation energies (such as the formation of nickel pipes).

FIG. 4 illustrates that the sub-second anneal method may have a longer thermal cycle than flash/laser anneal processes. FIG. 4 shows that, in some embodiments, the sub-second anneal method heats the wafer for a longer period of time than flash/laser annealing process. FIG. 4 also shows that the sub-second anneal method may, in certain instances, require more time to cool the wafer than flash/laser annealing process. In fact, in some embodiments, the described sub-second anneal method lasts approximately 2 to 100 times longer than either flash or laser anneal. This longer anneal time may enable the sub-second anneal method to use lower temperatures than flash or laser anneal and yet still react nickel to the silicon to form a nickel salicide with suitable electrical properties.

The temperatures employed in the sub-second anneal method also differ from the temperatures employed in conventional RTP and flash anneal. With respect to conventional RTP, FIG. 4 illustrates that in some embodiments, the sub-second anneal method may involve raising the temperature of the wafer above the temperature required by conventional RTP. FIG. 4 also illustrates that the sub-second anneal method may require lower peak temperatures than those involved in flash/laser anneal process. Accordingly, the described sub-second anneal method may satisfy the peak thermal constraints of some structures in semiconductor devices (HiK/metal gate stacks) which flash/laser anneals may not.

FIG. 2 illustrates one apparatus that can be used to perform sub-second annealing methods. The wafer 5 containing the silicon surface on which the Ni has already been deposited is placed on the thermally conductive support, the chuck (or platen) 10. The apparatus also contains the heat sources 15 that impinge the light/energy onto the wafer. In other configurations, the apparatus could also contain a thermally conductive or radiative heat source to make the wafer attain an intermediate temperature prior to the sub-second anneal. The heat transmitted through the support 10 can also be emitted 20 from the substrate 10 into the ambient environment.

The cooling process using the sub-second annealing method and apparatus can proceed faster than conventional RTP. These RTP anneals may heat the entire wafer and therefore cooling is limited by thermal conduction and radiation from the wafer. Sub-second anneal processes, on the other hand, may heat only a fraction of the thickness of the wafer in a short period of time. The heat from the part of the wafer subjected to the anneal may be quenched and removed by conduction through the unheated fraction of the wafer. As mentioned, the addition of a thermally conductive wafer support and/or flow of suitable gases could provide additional cooling to the wafer.

Figure 5:
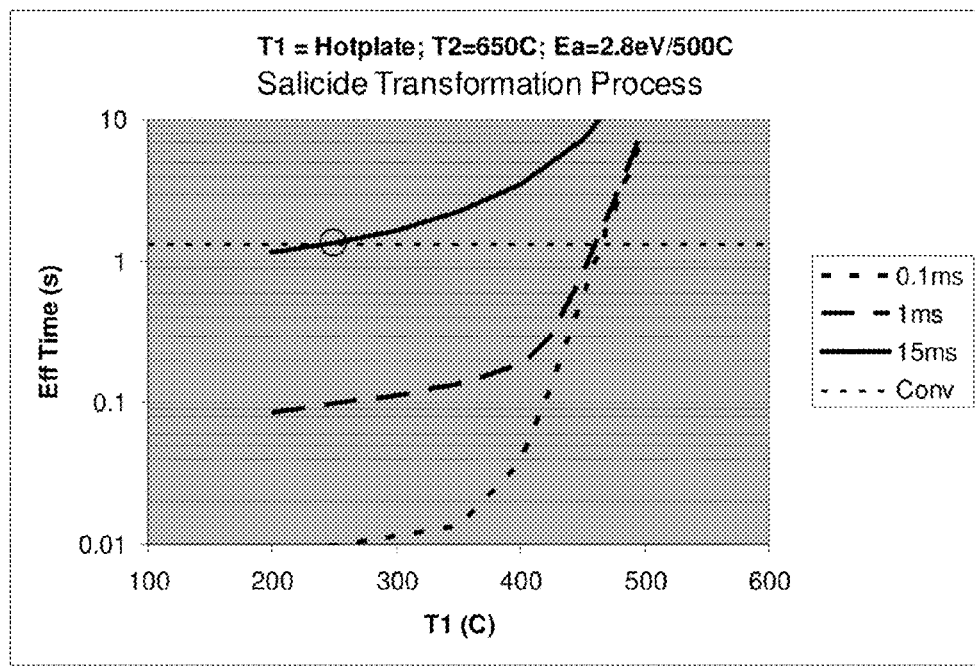
FIGS. 5 and 6 contain graphs showing theoretical results from sub-second annealing.

FIG. 5 contains a graph with theoretical results showing some embodiments where the thermal budget of the sub-second anneal process can be matched to the thermal budget of conventional RTP processes. In FIG. 5, the thermal reaction time is plotted as a function of the intermediate anneal temperature (attained using a suitable heat source) for the sub-second anneal process for nickel silicide anneal with an empirically determined activation energy of 2.8 eV. As shown in FIG. 5, for a constant peak temperature, the time period for the sub-second anneal determines the intermediate temperature required to obtain the same quality of metal salicide as conventional RTP anneals. The sub-second anneal is about 50 to about 10,000 times faster than such conventional RTP anneals.

Figure 6:
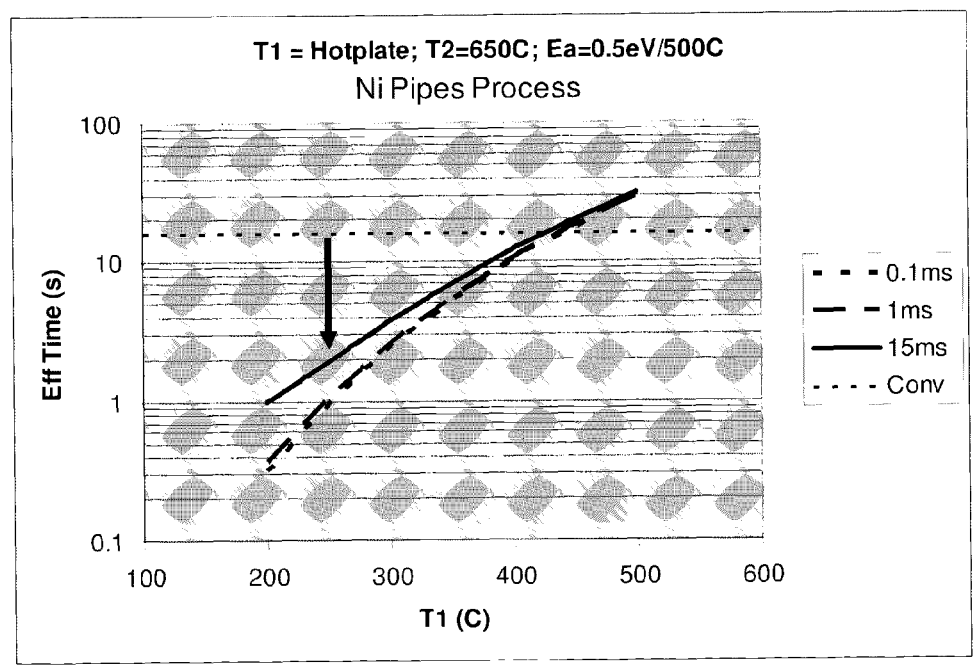

FIG. 6 also contains a graph with theoretical results. FIG. 6 illustrates that when the thermal budget of the sub-second anneal process is matched to the thermal budget for conventional RTP, the quality of the metal salicide is maintained and unwanted diffusion of Ni is significantly reduced. In FIG. 6, the thermal reaction time is plotted as a function of the intermediate anneal temperature for the sub-second anneal process for the diffusion of nickel (through defects in the substrate) with a low activation energy of 0.5 eV. In both FIGS. 5 and 6, each of the individual curves represents a different duration of the heat pulse for the sub-second anneal method. The black dashed lines in FIGS. 5 and 6 represent the equivalent reaction time for a conventional anneal process. In essence, the thermal cycle for the sub-second anneal can be optimized to drive processes with desired activation energies (such as formation and/or phase transformations of nickel salicide) while impeding processes with undesired activation energies (such as formation of nickel pipes).

Having described the preferred aspects of the semiconductor devices and associated methods, it is understood that the appended claims are not to be limited by particular details set forth in the above description, as many apparent variations thereof are possible without departing from the spirit or scope thereof.

The invention claimed is:

1. An annealing method for semiconductor devices, comprising:
    providing a wafer with a first surface containing a metal-containing material proximate the first surface;
    heating the wafer from about 0.01 to about 100 milliseconds with an energy ranging from about 1 to about 1,000 J/cm$^2$; and
    cooling the wafer using an unheated fraction of the wafer, a thermally conductive support, or a suitable gas flow.

2. The method of claim 1, wherein the heating process is configured to drive a first sub-process with first activation energy and impede a second sub-process with a second, lower activation energy.

3. The method of claim 2, wherein first surface comprises silicon and the metal-containing material comprises nickel, and wherein the first sub-process comprises the formation of a nickel salicide.

4. The method of claim 2, wherein the second sub-process comprises the formation of nickel pipes.

5. The method of claim 1, further comprising heating the wafer to an intermediate temperature with a conductive heat source or a radiative heat source.

6. The method of claim 1, wherein the heating process is performed at an energy ranging from about 20 to about 40 J/cm$^2$.

7. The method of claim 1, wherein the heating process is performed for about 1 to about 20 milliseconds.

8. The method of claim 1, wherein the cooling process is performed for a time ranging from about 1 to about 100 seconds.

9. The method of claim 1, wherein a thermal cycle comprising the heating process and the cooling process is substantially completed in less than a second.

10. The method of claim 9, wherein the heating process is performed for a time ranging from about 0.1 to about 100 milliseconds.

11. The method of claim 9, wherein the heating process is performed at an energy ranging from about 20 to about 40 $J/cm^2$.

12. The method of claim 9, wherein the cooling process is performed for a time ranging from about 0.1 to about 100 seconds.

13. The method of claim 9, wherein the cooling process involves cooling the wafer at a rate ranging from about 5 to about 200 degrees/second.

14. An annealing method for semiconductor devices, comprising:
provide a wafer containing a silicon surface with a nickel-containing material proximate the silicon surface;
placing the wafer on a thermally conductive support;
heating the wafer for tens of milliseconds with an energy ranging from about 1 to about 100 $J/cm^2$ to form a nickel salicide material with suppressed nickel pipe formation; and
cooling the wafer using the thermally conductive substrate.

15. The method of claim 14, wherein the heating process is performed for about 15 milliseconds.

* * * * *